(12) United States Patent
Gupte et al.

(10) Patent No.: US 12,207,398 B2
(45) Date of Patent: Jan. 21, 2025

(54) ELECTRONIC DEVICE CARRIER STRUCTURES INCLUDING POLYMER LAYERS AS BARRIERS TO SOLID STATE SOLDER DIFFUSION AND METHODS OF FORMING THE SAME

(71) Applicants: Georgia Tech Research Corporation, Atlanta, GA (US); Intel Corporation, Santa Clara, CA (US)

(72) Inventors: Omkar Gupte, Atlanta, GA (US); Vanessa Smet, Atlanta, GA (US); Gregorio R. Murtagian, Phoenix, AZ (US)

(73) Assignees: Georgia Tech Research Corporation, Atlanta, GA (US); Intel Corporation, Santa Clara, CA (US)

(*) Notice: Subject to any disclaimer, the term of this patent is extended or adjusted under 35 U.S.C. 154(b) by 143 days.

(21) Appl. No.: 17/664,408

(22) Filed: May 21, 2022

(65) Prior Publication Data

US 2022/0386457 A1 Dec. 1, 2022

Related U.S. Application Data

(60) Provisional application No. 63/194,633, filed on May 28, 2021.

(51) Int. Cl.
   *H05K 1/02* (2006.01)
   *H05K 1/09* (2006.01)
   *H05K 3/22* (2006.01)

(52) U.S. Cl.
   CPC ............ *H05K 1/0296* (2013.01); *H05K 1/09* (2013.01); *H05K 3/22* (2013.01); *H05K 2201/10734* (2013.01)

(58) Field of Classification Search
   CPC .......... H05K 1/02; H05K 1/0296; H05K 3/22; H05K 2201/10734; H05K 1/09
   USPC ......................................................... 361/760
   See application file for complete search history.

(56) References Cited

U.S. PATENT DOCUMENTS

2006/0196917 A1* 9/2006 Viero ................. H01L 21/6835
228/208

OTHER PUBLICATIONS

Gupte, et al.; "Innovative socketable and surface-mountable BGA interconnections" IEEE 69th Electronic Components and Technology Conference (ECTC) (May 2019); pp. 1028-1034.

(Continued)

*Primary Examiner* — Tremesha W Burns
(74) *Attorney, Agent, or Firm* — Stanek Lemon Crouse & Meeks, PA

(57) ABSTRACT

An electronic device carrier structure can include a substrate including a plurality of electrical contacts spaced apart on the substrate, a plurality of electrically conductive balls, each of the electrically conductive balls being on a respective one of the plurality of electrical contacts, solder attaching each of the electrically conductive balls to respective ones of the electrical contacts to form an attachment boundary where the solder ends on a surface of each of the plurality of electrically conductive balls, and a polymer layer extending on the substrate onto the plurality of electrically conductive balls to form a surface of the polymer layer at a contact point on the plurality of electrically conductive balls that is above the attachment boundary and below an apex of each of the plurality of electrically conductive balls.

19 Claims, 10 Drawing Sheets

(56) References Cited

OTHER PUBLICATIONS

Gupte, et al.; "Effect of solder paste volume and reflow parameters on solder paste wicking and joint shear strength of Ni—Au-coated Cu spheres" IEEE Transactions on Components, Packaging and Manufacturing Technology, 10(5); May 2020 pp. 828-835.

Gupte, et al.; "Thermal Aging Reliability of Socketable BGA Packages With Ni—Au-Coated SAC305 Spheres" IEEE Transactions on Components, Packaging and Manufacturing Technology, 10(12), Dec. 2020; pp. 2118-2124.

Gupte, et al.; "Thermal aging reliability of socketable, surface-modified solder BGAs with and without polymer collars" IEEE 70th Electronic Components and Technology Conference (ECTC) (2020) pp. 512-517.

Gupte, et al.; "Solid-state diffusion studies of lead-free solders on gold and in polymer films. Journal of Materials Science: Materials in Electronics" 33(10), Feb. 2022; pp. 7679-7690.

* cited by examiner

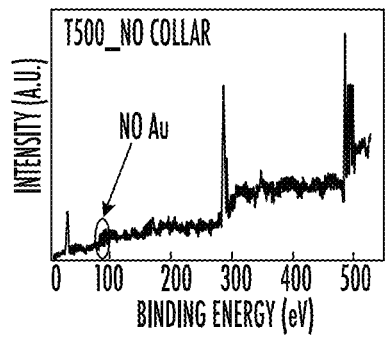
FIG. 7C
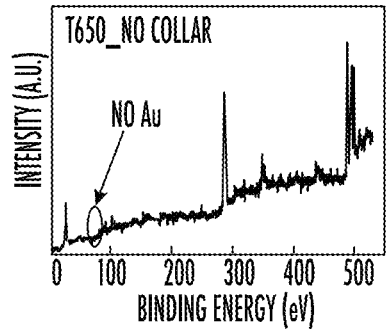
FIG. 7D
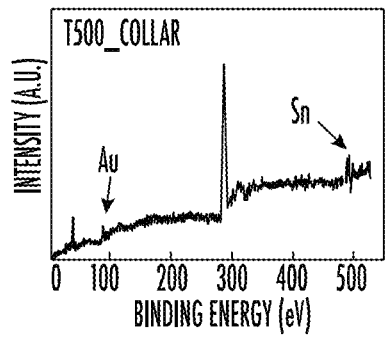
FIG. 7G
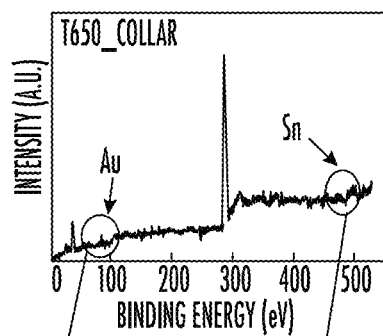
FIG. 7H
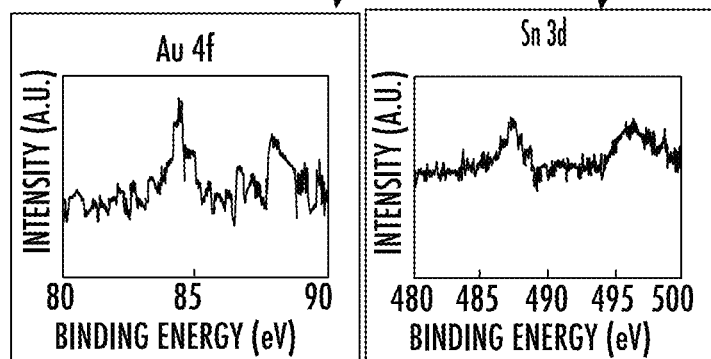
FIG. 7I
FIG. 7J ELECTRONIC DEVICE CARRIER STRUCTURES INCLUDING POLYMER LAYERS AS BARRIERS TO SOLID STATE SOLDER DIFFUSION AND METHODS OF FORMING THE SAME

CLAIM FOR PRIORITY

This application claims priority to Provisional Application Ser. No. 63/194,633, Polymer Collars as Mechanical Diffusion Barriers for Solid State Solder Diffusion, filed in the U.S. Patent and Trademark Office on May 28, 2021, the entire disclosure of which is hereby incorporated herein by reference.

STATEMENT OF GOVERNMENT SUPPORT

This invention was made with government support under Grant No. HR0011-13-3-0002 awarded by the Department of Defense/Defense Advanced Research Projects Agency (DARPA). The government has certain rights in the invention.

FIELD

The present invention relates to the field electronics in general, and more particularly, to interconnect for electronic devices.

BACKGROUND

Microprocessors (and similar devices) have traditionally been packaged using Land Grid Array (LGA) designs and have been press-fitted into sockets. However, Ball Grid Array (BGA) designs, used in surface mount (SMT) applications, have concurrently gained popularity primarily due to their smaller form factor and improved electrical performance owing to the reduced interconnection length. BGA packages, when used directly in sockets, may face several challenges, such as damage to the soft solder spheres under the socket latching force, surface oxidation of the spheres, and intermetallic (IMC) formation between the solder spheres and the socket paddles, which may increase the contact resistance and degrade reworkability.

To address these challenges, different compliant contact technologies, such as tweezer contact, Dendriplate, and four-point crown, have been developed that minimize the damage to the solder spheres and expose a fresh layer of solder underneath the native oxide layer.

SUMMARY

Embodiments according to the present invention can provide electronic device carrier structures including polymer layers as barriers to solid state solder diffusion and methods of forming the same. Pursuant to these embodiments, an electronic device carrier structure can include a substrate including a plurality of electrical contacts spaced apart on the substrate, a plurality of electrically conductive balls, each of the electrically conductive balls being on a respective one of the plurality of electrical contacts, solder attaching each of the electrically conductive balls to respective ones of the electrical contacts to form an attachment boundary where the solder ends on a surface of each of the plurality of electrically conductive balls, and a polymer layer extending on the substrate onto the plurality of electrically conductive balls to form a surface of the polymer layer at a contact point on the plurality of electrically conductive balls that is above the attachment boundary and below an apex of each of the plurality of electrically conductive balls.

BRIEF DESCRIPTION OF THE DRAWINGS

FIGS. 7(a)-(j) show XPS data for a test structure evaluated at 120 degrees Centigrade with devices formed with the polymer collars compared to devices formed without the polymer collars according to embodiments of the invention.

DETAILED DESCRIPTION OF EMBODIMENTS ACCORDING TO THE INVENTION

Figure 1:
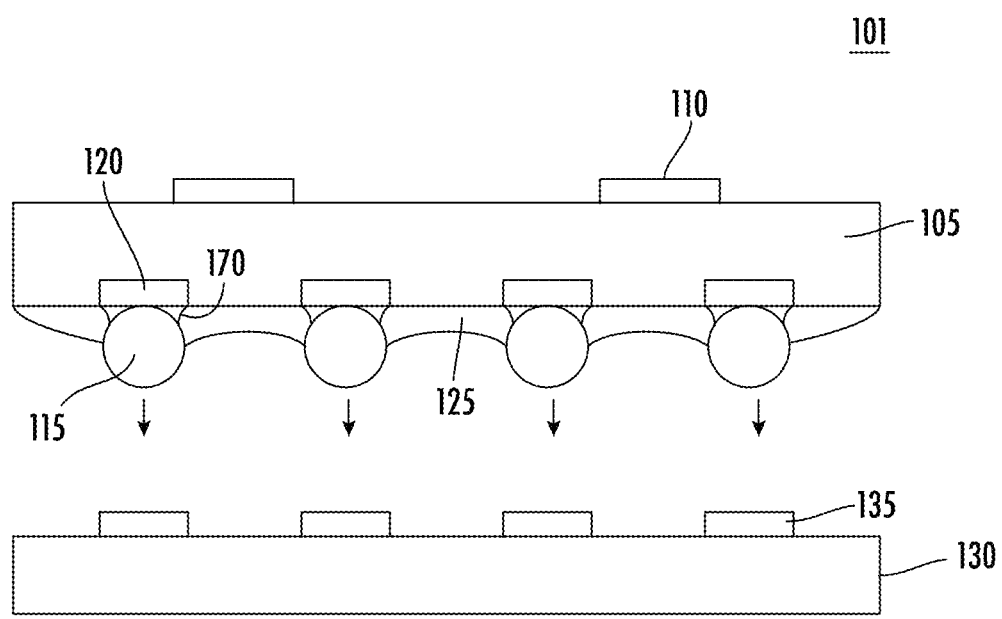
FIG. 1 is a schematic illustration of an electronic device carrier including a substrate, positioned over a device, the substrate including electrically conductive balls attached to electrical contacts on the substrate by solder that is encapsulated by a polymer layer that extends on the substrate to contact the electrically conductive balls in some embodiments according to the invention.

Exemplary embodiments of the present disclosure are described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

As appreciated by the present inventors, Ball Grid Array (BGA) package designs are increasingly used in surface mount applications while Land Grid Array (LGA) designs are predominantly used in socketing. BGA spheres with a noble metal surface may provide a stable mechanical contact interface with the socket paddles. These noble contact interfaces, however, should remain intact throughout the socketing life of the product.

As disclosed herein, in some embodiments according to the invention, polymer collars can be formed on electrically conductive balls (such as solder balls) to prevent solid-state wicking of constituent material in the solder along the surface of the ball, which may otherwise affect the electrical conductivity of the ball. As described herein, in some embodiments according to the invention, the polymer collars may be formed by spin-coating a polymer material on the surface of a substrate that can have the conductive balls mounted thereon.

Experiments were performed on samples that included polymer collar. For example, polymer material was spin coated onto a substrate to form polymer collars according to embodiments of the present invention, on Au coated solder balls adhered to the substrate. The substrate was then aged alongside a reference package with no polymer collars, at accelerated test temperatures of 100° C. and 120° C., respectively. After 650 hours of aging, XPS studies showed no Au signal but a strong Sn signal in the reference package (without the polymer collars), which evidenced solder wicking from the solder ball-attach joints to an upper portion of the solder ball, whereas the Au signal was detected for the package with the polymer collars, evidencing that the polymer collars did inhibiting solid-state solder wicking from the ball-attach joints. The joints with polymer collars also showed mechanical stability throughout thermal aging with a 3× improvement in joint shear strength.

In still further experiments on devices formed according to embodiments of the present invention, the surfaces of the solder balls in a BGA interconnect were covered with multi-layered metallic coatings configured to be compatible with socketing and SMT applications. The coating included a diffusion barrier/noble metal combination with thicknesses configured to control interfacial reactions. The coating was directly applied on the spheres prior to their attach onto the BGA packages with solder paste. In some embodiments according to the present invention, a Ni—Au coating may be used to provide a diffusion barrier. In a socketing system configured for use with embodiments according to the present invention, the Au may provide a stable mechanical contact interface between the coated balls and the socket paddles and the Ni may prevent the diffusion of Sn from the solder core to the outer surface of the balls.

FIG. 1 is a schematic illustration of an electronic device carrier 101 including a substrate 105, positioned over a device 130, the substrate 105 including electrically conductive balls 115 attached to electrical contacts 120 on the substrate 105 by solder 170 that is encapsulated by a polymer layer 125 that extends on the substrate 105 to contact the electrically conductive balls 115 in some embodiments according to the invention. According to FIG. 1, in some embodiments according to the invention, the device 130 can be part of a circuit board or other structure that carries electrical devices where the electronic device carrier 101 is subjected to a solder reflow process to couple the device carrier 101 to the circuit board or other structure. Accordingly, in such embodiments according to the invention, the electronic device carrier 101 can be configured as what is sometimes referred to as a Ball Grid Array. The electronic device carrier 101 can carry one or more electronic devices 110, which can be electrically connected to the electrical contacts 120.

As appreciated by the present inventors, the electrically conductive balls 115 can be attached to the electrical contacts 120 by a paste, such as solder paste, that includes constituent elements that may (if not addressed) diffuse along the surface of the electrically conductive balls 115 to reach a portion which is configured to contact the electrical contacts 130. Accordingly, in some embodiments according to the invention, the polymer layer 125 can be formed to cover an attachment boundary 165 on the surface of the electrically conductive balls 115 where the solder attaches to the electrically conductive balls 115. The polymer layer 125 can provide a barrier against the diffusion of the elements included in the solder on the surface of the electrically conductive balls 115.

In some embodiments according to the invention, the device 130 can be part of a socket that allows the electronic device carrier 101 to be removably coupled to socket. Accordingly, in some embodiments according to the invention, the electronic device carrier 101 can be configured as what is sometimes referred to as a Land Grid Array. The device 130 can include contacts 135 thereon that are configured to be coupled to respective ones of the electrically conductive balls 115.

It will be understood that, in some embodiments according to the invention, the electrically conductive balls 115 can be solder. In some embodiments according to the invention, the electrically conductive balls 115 can be copper. Other materials can also be used. It will be understood that in some embodiments according to the invention, the term "electrically conductive balls" can include any material that is sufficient for electrical connectivity between electrical components. It will be understood that in some embodiments according to the invention, the term "electrically conductive" includes materials that provide a specific resistivity of less than about $10^{-3}$ ohm-cm$^2$ and, in some embodiments less than about $10^{-4}$ ohm-cm$^2$ to about $10^{-6}$ ohm-cm$^2$.

Figure 2A:
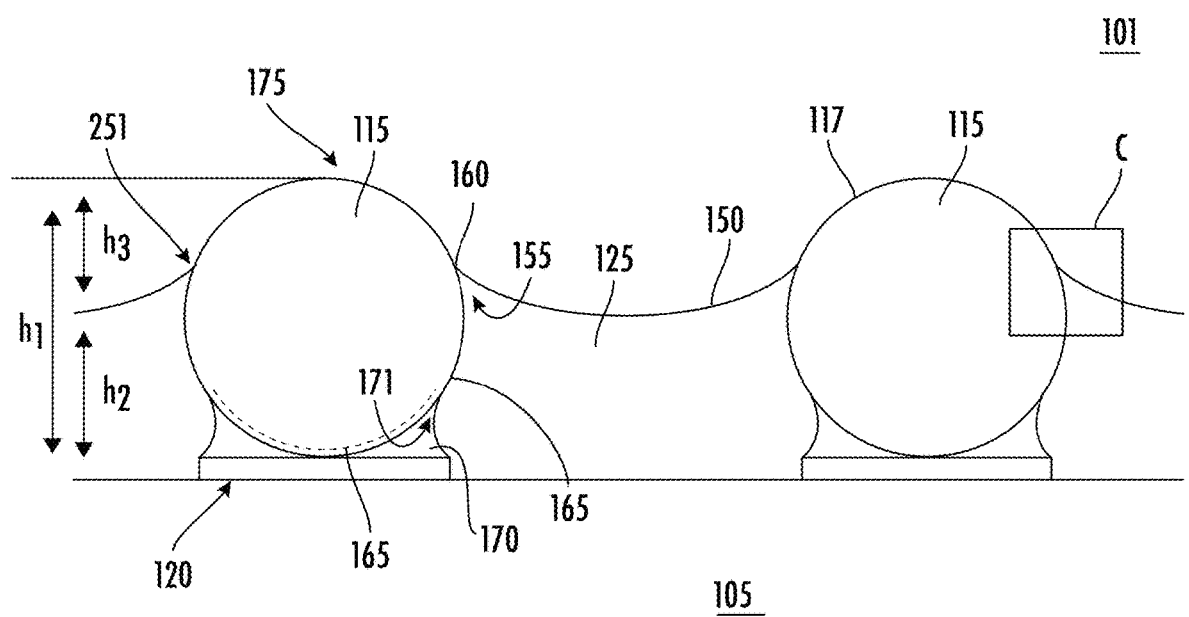
FIG. 2A is a schematic illustration of the polymer layer extending on the substrate to form polymer fillets at contact points on the surfaces of the electrically conductive balls above where the solder attaches the electrically conductive balls to the electrical contacts on the substrate in some embodiments according to the invention.

FIG. 2A is a schematic illustration of the polymer layer 125 extending on the substrate 105 to form polymer fillets 155 at contact points 160 on the surfaces 117 of the electrically conductive balls 115 above where the solder 170 attaches the electrically conductive balls 115 to the electrical contacts 120 in some embodiments according to the invention. As further shown in FIG. 2A, the upper surface 150 of the polymer layer 125 extends over the substrate 105 to contact the surfaces 117 of the electrically conductive balls 115 at respective contact points 160. The contour of the upper surface 150 of the polymer layer 125 curves upward proximate to the surface 117 to form a polymer fillet 155 at the surface 117 as shown.

The solder 170 attaches the electrically conductive balls 115 to the contacts 120 to form an attachment boundary 165 where the solder ends on the surface 117. The contact point 160 is high enough on the surface 117 to cover the attachment boundary 165 to prevent the diffusion of the constituent elements of the solder over time. In some embodiments according to the invention, the maximum height of the electrically conductive balls 115 about the surface of the substrate 105 is h1, whereas the maximum height of the attachment boundary 165 above the substrate 105 is h2. As described herein, the viscosity of the polymer material can be selected based on the ration of h1/h2 so that the height of the polymer layer 125 is formed to be above the attachment boundary 165 but below the apex 175 of the electrically conductive balls 115. In some embodiments according to the invention, the height of the polymer layer 125 is at about the mid-point 251 between the attachment boundary 165 and the apex 175.

Figure 2B:
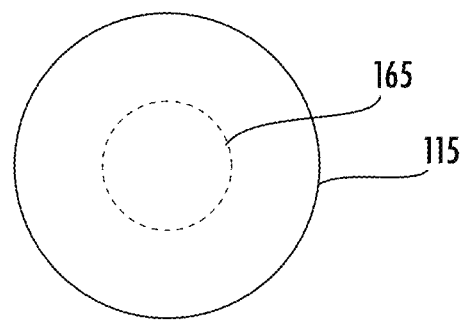
FIG. 2B is a schematic illustration of an electrically conductive ball on the substrate and an attachment boundary, where the solder that attaches the electrically conductive ball to the electrical contact, ends in some embodiments according to the invention.

FIG. 2B is a plan view of the electrically conductive ball 115 on the substrate 105 in FIG. 2A and the attachment boundary 165, where the solder that attaches the electrically conductive ball 115 to the electrical contact 12 ends in some embodiments according to the invention.

Figure 2C:
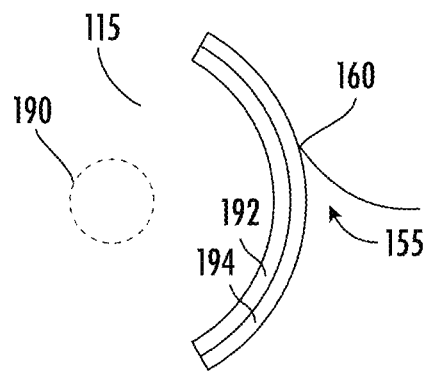
FIG. 2C is a schematic illustration of the region C in FIG. 2A including layers on the electrically conductive ball that provide the surface of the electrically conductive ball contacted by a surface of the polymer layer at a contact point above the attachment boundary and below an apex of the electrically conductive ball in some embodiments according to the invention.

FIG. 2C is a enlarge illustration of the region C in FIG. 2A including multiple layers formed on the electrically conductive ball 115 to provide the surface 117 of the electrically conductive ball 117 contacted by the upper surface 150 of the polymer layer 125 at the contact point 160 above the attachment boundary 165 and below the apex 175 of the electrically conductive ball in some embodiments according to the invention. As shown in FIG. 2C, the multiple layers can include layer an inner layer 192 and an outer layer 194. In some embodiments according to the invention, the outer layer 194 can be noble metal. In some embodiments according to the invention, the inner and outer layers 192, 194 can be metals. Additional layers may also be formed. In some embodiments according to the invention, the electrically conductive ball 115 can include a polymer core 190.

Figure 3:
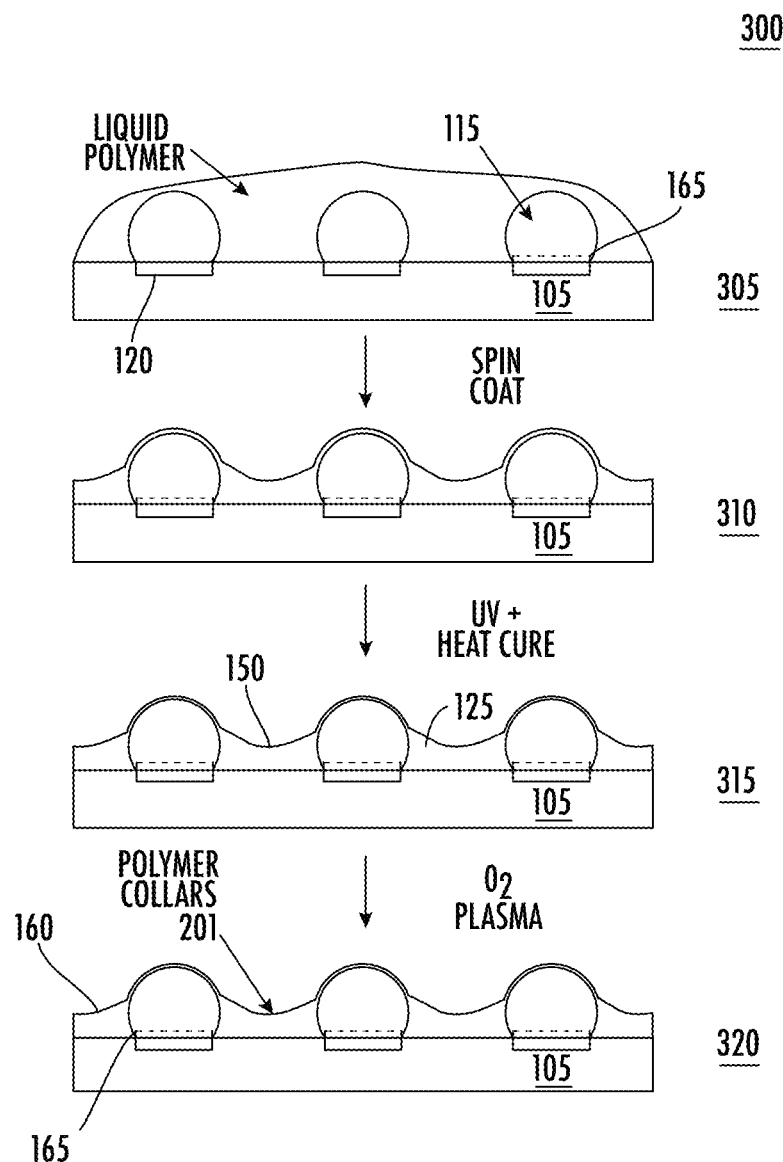
FIG. 3 is a flow chart illustrating the formation of polymer collars by spin-coating a polymer material on a BGA package (as the substrate) to form the polymer layer having the polymer fillets covering the attachment boundaries of the solder in some embodiments according to the invention.

FIG. 3 is a flowchart 300 illustrating the formation of polymer collars 201 by spin-coating a polymer material on a BGA package (as the substrate 105) to form the polymer layer 125 having the polymer fillets 155 covering the attachment boundaries 165 on the electrically conductive balls 115 in some embodiments according to the invention. According to FIG. 3, the electrically conductive balls 115 can be initially attached to the electrical contacts 120 by, for example, a solder paste. The solder paste is configured to hold the electrically conductive balls 115 to the electrical contacts 120 during, for example, a solder reflow process where the solder paste liquifies and forms an attachment boundary 165 on the surface of the electrically conductive balls 115 indicating where the reflowed solder ends. Accordingly, the constituent elements of the solder paste may remain in the reflowed solder after the reflow process is complete. As appreciated by the present inventors, however, the polymer collars 201 described herein can be formed on the surface of the electrically conductive balls 115 beyond the attachment boundary 165 to cover the location of the reflowed solder. Accordingly, the diffusion of the elements of the solder paste still contained within the reflowed-solder may be prevented so that the adverse effects on the electrically conductive balls 115 may be reduced.

Still referring to FIG. 3, the polymer material is applied to the surface of the substrate (Block 305). The polymer collars 201 can be formed by spin-coating the polymer material, such as a thermoset material, on the substrate 105 to distribute the polymer material between adjacent electrically conductive balls 115 and to form the polymer fillets 155 where the surface of the polymer layer 125 contacts the electrically conductive balls. The polymer fillets can be above (and thereby cover) the attachment boundary 165 to reduce the diffusion of constituent materials include in the material used to attach the electrically conductive balls to the electrical contacts 120 (such as SBA in solder). In some embodiments according to the invention, the polymer material applied to the substrate 105 can be MasterBond® UV-15. The polymer collars 201 may also provide increased joint shear strength.

The spin-coated polymer layer 125 can be cured using 365 nm UV light, followed by heating at 120° C. for 30 min (Block 315). The spin coating may also cause a thin layer of polymer to be deposited on the top surface of the electrically conductive balls 115. This surface contamination may be removed by subjecting the package to 1.5 min of $O_2$ plasma at 250 W power in some embodiments according to the invention (Block 320).

In some embodiments according to the present invention, the polymer layer 125 includes a polymer material having a glass transition temperature that is at least 20 degrees Centigrade greater than the operating temperature range of the electronic devices that are carried by the electronic devices 110. In some embodiments according to the present invention, the polymer layer includes a polymer material having a glass transition temperature that is at least equal to a melting temperature of the solder 170. In some embodiments according to the present invention, the polymer layer includes a polymer material having a glass transition temperature in a range between about 120 degrees Centigrade and about 140 degrees Centigrade. In some embodiments according to the present invention, the polymer layer includes a polymer material having a glass transition temperature in a range between about 160 degrees Centigrade and about 170 degrees Centigrade. In some embodiments according to the present invention, the glass transition temperature of the polymer material used to form the polymer layer 125 is at least 138 degrees Centigrade.

Figure 5:
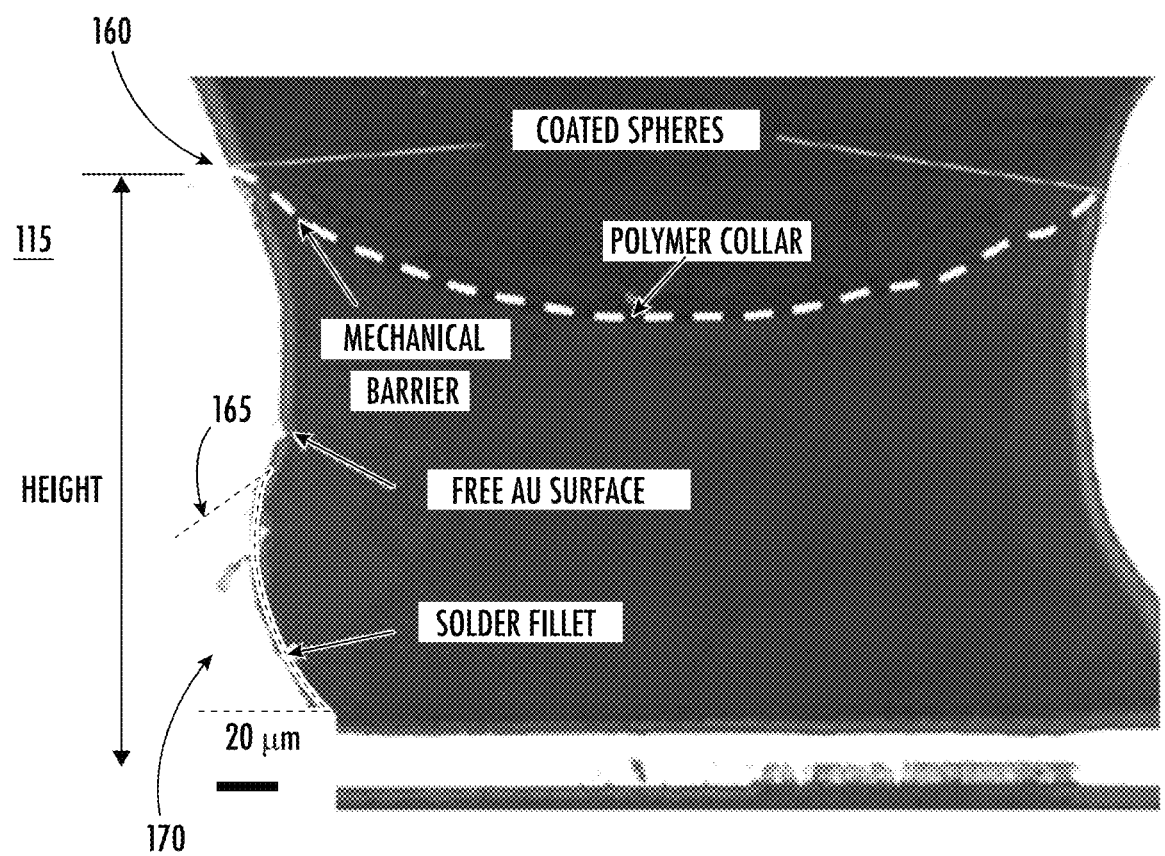
FIG. 5 is an image illustrating adjacent electrically conductive (solder) balls formed according to embodiments of the present invention.
Figure 6A:
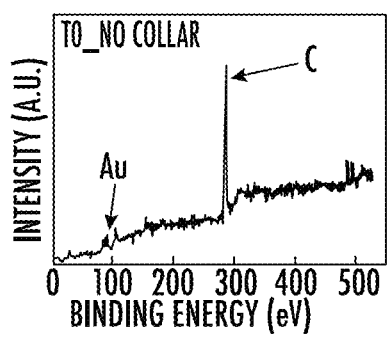
FIGS. 6(a)-(j) show XPS data for a test structure evaluated at 100 degrees Centigrade with devices formed with the polymer collars compared to devices formed without the polymer collars according to embodiments of the invention.
Figure 6B:
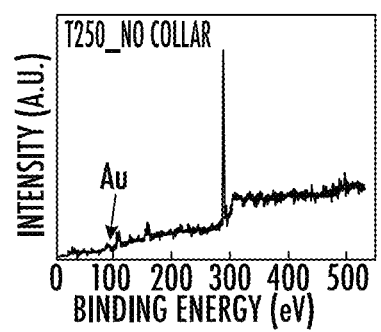
Figure 6E:
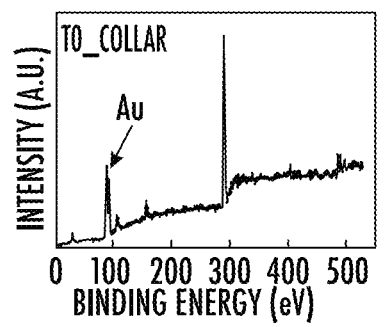
Figure 6F:
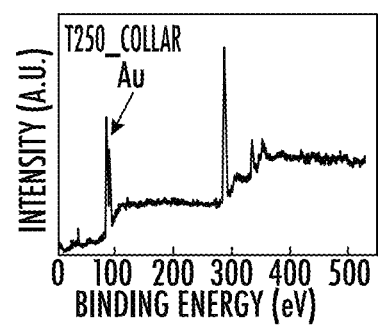
Figure 6C:
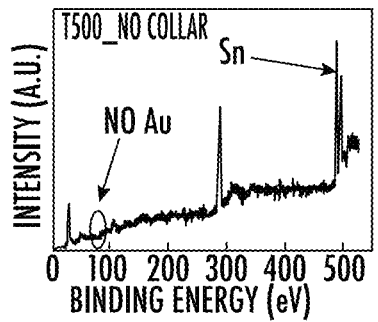
Figure 6D:
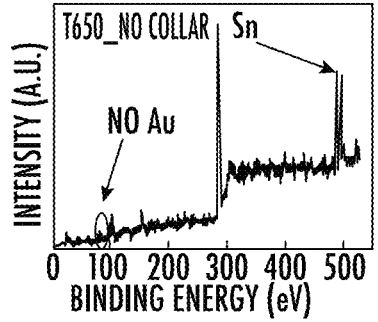
Figure 6G:
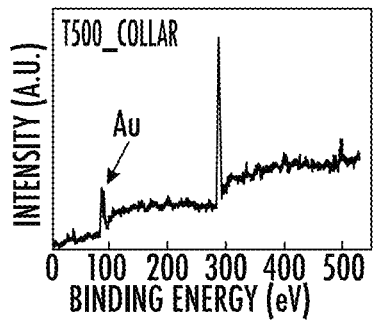
Figure 6H:
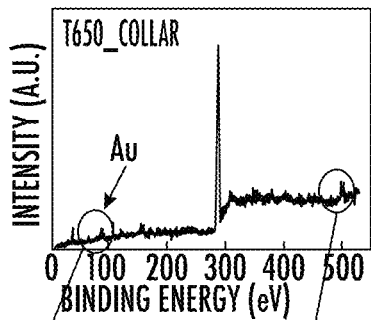
Figure 6I:
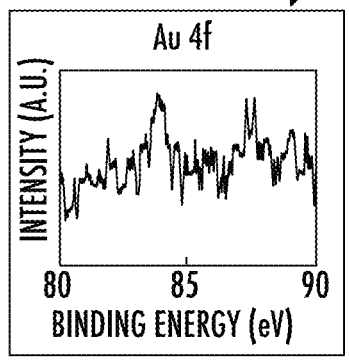
Figure 6J:
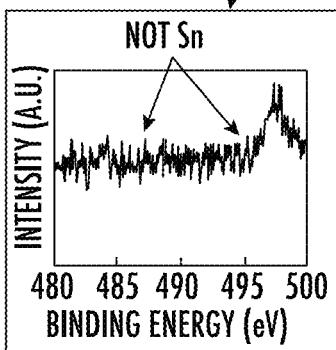
Figure 7A:
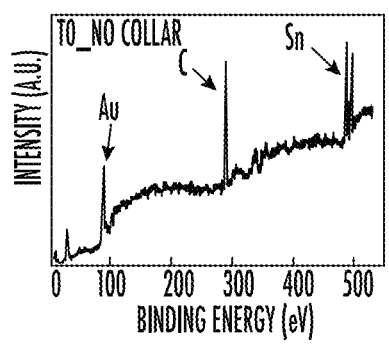
Figure 7B:
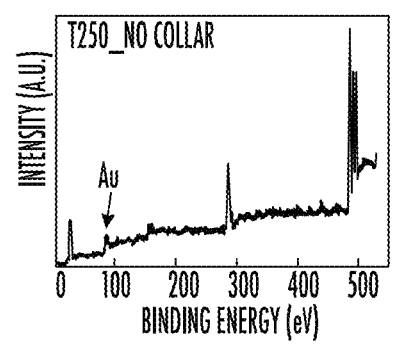
Figure 7E:
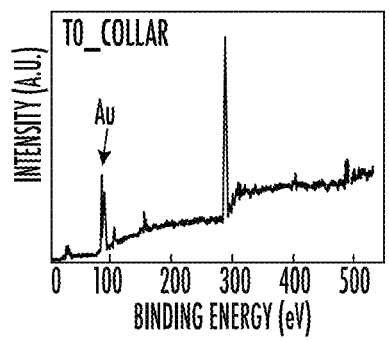
Figure 7F:
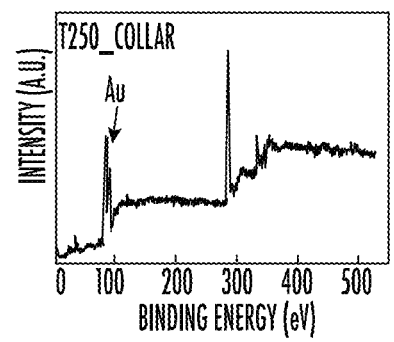

FIG. 5 is an image illustrating adjacent electrically conductive (solder) balls 115 formed according to embodiments of the present invention. The solder balls were formed to a 250 μm diameter and were covered with a multi-layered coating including a 3 μm Ni layer and a 200 nm Au layer. The multi-layered coating was formed by initially sputtering a Ni seed layer, followed by electroless Ni immersion Au (ENIG) coating. A 5 mm×5 mm organic BGA package was formed with 1.5 μm-thick FR-4 cores arranged in a 10×10 area array at a 500 μm pitch on the BGA package. A low-temperature SBA paste was printed on the ENIG-coated Cu pads using a stencil, followed by placing the coated solder spheres onto the BGA package and reflowing with a time above liquidus (TAL) of 90 s to obtain the solder joint fillet 171 shown at a height that was less than half the height of the solder ball. The surfaces of the solder balls 115 above the polymer collars (i.e., above the surface 150 of the polymer layer 125) were substantially free of contamination of the constituent elements of the solder paste.

In some embodiments according to the invention, the height of the polymer collars (such as the contact point 160 where the surface of the polymer layer 150 contacts the surface of the electrically conductive balls 115) can be configured so as to completely cover the solder joint (i.e., the attachment boundary). In other words, the height of the surface of the polymer layer 150 which comes into contact with the surface of the electrically conductive balls 115 above the attachment boundary but below the apex 175 of the solder balls can be configured by selecting the spin coating parameters, such as spinning speed and time.

Figure 4:
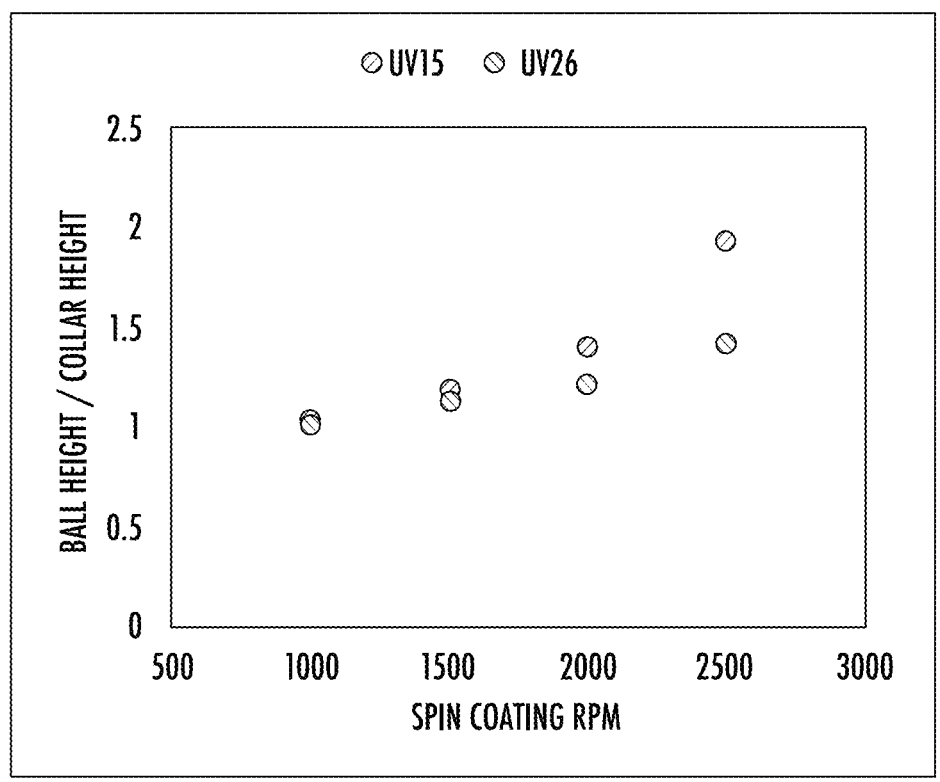
FIG. 4 is a graph of the ratio of the height of the electrically conductive balls to the height of the polymer collar plotted against the spin coating RPM in some embodiments according to the invention.

The dependence of the polymer collar height on the spin coating speed is highlighted in FIG. 4 in some embodiments according to the invention. The collar height was measured from the surface of the substrate 105 to the point where the polymer collars 201 contacted the electrically conductive balls 115. Due to the nature of the spin-coating process, the height of the polymer collars is dependent on the height of the electrically conductive balls 115 themselves, which can vary from sample to sample. The ratio of the height of the electrically conductive balls 115 to the height of the polymer collar is plotted against the spin coating RPM in FIG. 4 to normalize the effect of varying ball heights in different packages. As shown in FIG. 4, at higher RPMs the ratio of the height of the electrically conductive balls 115 to the height of the polymer collar increases, which means that the absolute collar height is reduced. Based on this result, the spin coating was done for 30 seconds at 2000 RPM to form exemplary polymer collars 201 according to some embodiments of the present invention. FIG. 5 shows an image of an exemplary substrate 105 with polymer collars 201 formed as described above in some embodiments.

As a comparison, two test structures were formed: one test structure was formed with the polymer collars according to embodiments of the invention and one test structure was formed without polymer collars. Each test structure was aged at temperatures of 100° C. and 120° C., respectively. The composition of the top surface of the thermally aged BGAs was monitored by XPS, with a 50 μm spot size, as fabricated and at aging times of 250 h, 500 h and 650 h. The XPS survey scan images of the top sphere surface for as-fabricated samples with and without polymer collars and after 250 h, 500 h and 650 h of thermal aging at temperatures of 100° C. and 120° C. are shown in FIGS. 6 and 7, respectively.

According to FIGS. 6 and 7, it can be observed that the Au signal intensity reduces with thermal aging at both temperatures, eventually disappearing, for samples without polymer collars. It will be understood that the presence of the peak can be used to determine the presence of the element rather than the intensity of the peak alone. In the case of samples without polymer collars, the presence of Sn on the surface of the spheres was further confirmed by EDX analysis, as due to the curved nature of the analyzed spherical surface and relatively large spot size (50 μm) of the XPS tool used in this study, the detector may catch parasitic amounts of Sn from the area around the sphere, which shows up on the scan. An example of this is seen in FIG. 6 (a) and FIG. 7 (a) where Sn signal can be seen in the as-fabricated samples. The growing presence of Sn through aging of the as-fabricated samples, as shown in FIG. 6 (a)-(d) and FIG. 7 (a)-(d), indicates continuous solid-state wicking of the solder from the joints to the top surface of the spheres, eventually consuming the entire layer of Au.

In contrast to the above, and as seen in FIGS. 6 (e)-(h), in the sample with polymer collars aged at 100° C., the Au signal is maintained during the entire duration of thermal aging, with a slight reduction in intensity observed at 650 h. FIGS. 6(i) and 6(j) shows scans for Au and Sn in the sample illustrated in FIG. 6(h). As appreciated by the present inventors, the absence of doublet Sn peaks in FIG. 6 (j), evidences that Sn did not diffuse to the top surface after 650 h. This indicates that when the polymer collars cover the attachment boundary of where the solder balls are attached to the solder joints, the constituent components of the solder is captured by the polymer layer, which can provide a barrier to those constituent components of the solder from wicking along the surface toward the apex of the solder balls, where the constituent components of the solder could degrade the conductive nature of the solder balls (if unaddressed).

However, as seen in FIG. 7 (e)-(h) for the sample with polymer collars aged at 120° C., the Au signal intensity starts decreasing after 500 h of thermal aging, as with the sample at 100° C. FIGS. 7(i) and 7(j) shows scans for Au and Sn in the sample illustrated in FIG. 7(h), wherein the presence of minor amounts of Sn is also observed, as shown in FIG. 7 (j). This indicates that, at this temperature, some solid-state diffusion of solder does occur despite the presence of the polymer collars. This can be attributed to the relatively low glass transition temperature (Tg) of the cured polymer collars. The reported Tg of Masterbond® UV-15, when fully cured, is ~125° C., which is very close to the thermal aging temperature of 120° C. Due to the softness of the polymer, it may provide less barrier to the diffusion, which may lead to the solder components penetrating through the polymer collars and wicking on the sphere surface. Accordingly, in some embodiments according to the present invention, a polymer material with a Tg that is substantially higher than the thermal aging temperature may prevent this phenomenon and successfully capture the constituent components of the solder joints, which otherwise may diffuse. In other embodiments according to the present invention, a solder paste with melting point much higher than the thermal aging temperature may be used to reduce the diffusion rates of the solder, such as standard SAC alloys.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. Additionally, as used herein, the term "and/or" includes any and all combinations of one or more of the associated listed items and may be abbreviated as "/".

The term "comprise," as used herein, in addition to its regular meaning, may also include, and, in some embodiments, may specifically refer to the expressions "consist essentially of" and/or "consist of." Thus, the expression "comprise" can also refer to, in some embodiments, the specifically listed elements of that which is claimed and does not include further elements, as well as embodiments in which the specifically listed elements of that which is claimed may and/or does encompass further elements, or embodiments in which the specifically listed elements of that which is claimed may encompass further elements that do not materially affect the basic and novel characteristic(s) of that which is claimed. For example, that which is claimed, such as a composition, formulation, method, system, etc. "comprising" listed elements also encompasses, for example, a composition, formulation, method, kit, etc. "consisting of," i.e., wherein that which is claimed does not include further elements, and a composition, formulation, method, kit, etc. "consisting essentially of," i.e., wherein that which is claimed may include further elements that do not materially affect the basic and novel characteristic(s) of that which is claimed.

The term "about" generally refers to a range of numeric values that one of skill in the art would consider equivalent to the recited numeric value or having the same function or result. For example, "about" may refer to a range that is within ±1%, ±2%, ±5%, ±7%, ±10%, ±15%, or even ±20% of the indicated value, depending upon the numeric values that one of skill in the art would consider equivalent to the recited numeric value or having the same function or result. Furthermore, in some embodiments, a numeric value modified by the term "about" may also include a numeric value that is "exactly" the recited numeric value. In addition, any numeric value presented without modification will be appreciated to include numeric values "about" the recited numeric value, as well as include "exactly" the recited numeric value. Similarly, the term "substantially" means largely, but not wholly, the same form, manner or degree and the particular element will have a range of configurations as a person of ordinary skill in the art would consider as having the same function or result. When a particular element is expressed as an approximation by use of the term "substantially," it will be understood that the particular element forms another embodiment.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall support claims to any such combination or subcombination.

What is claimed:

1. An electronic device carrier structure comprising:
a substrate including a plurality of electrical contacts spaced apart on the substrate;
a plurality of electrically conductive balls, each of the electrically conductive balls being on a respective one of the plurality of electrical contacts;
solder attaching each of the electrically conductive balls to respective ones of the electrical contacts, wherein a surface of the solder terminates at an attachment boundary on a surface of each of the plurality of electrically conductive balls; and
a polymer layer on the substrate and partially on each of the plurality of electrically conductive balls, wherein a surface of the polymer layer terminates a contact point on each electrically conductive balls, the contact point being positioned between the attachment boundary and an apex of the respective electrically conductive ball, thereby forming a barrier around the solder for each electrically conductive ball.

2. The electronic device carrier structure of claim 1 wherein the surface of the polymer layer forms a polymer fillet on the surface of each of the plurality of electrically conductive balls at the contact point.

3. The electronic device carrier structure of claim 1 wherein the each of the plurality of electrically conductive balls is entirely encapsulated by a respective noble metal to form the surface of each of the electrically conductive balls.

4. The electronic device carrier structure of claim 1 wherein the each of the plurality of electrically conductive balls comprises a solder ball.

5. The electronic device carrier structure of claim 1 wherein the each of the plurality of electrically conductive balls comprises a copper ball.

6. The electronic device carrier structure of claim 1 wherein the each of the plurality of electrically conductive balls includes a polymer core.

7. The electronic device carrier structure of claim 1 wherein the each of the plurality of electrically conductive balls includes a multi-layered metallic coating.

8. The electronic device carrier structure of claim 1 wherein the contact point of the surface of the polymer layer is at about a mid-point between the attachment boundary and the apex of each of the plurality of electrically conductive balls.

9. The electronic device carrier structure of claim 3 wherein the respective noble metal is a respective noble metal layer included in a multi-layered covering on each of the plurality of electrically conductive balls.

10. The electronic device carrier structure of claim 1 further comprising:
an electronic device on the substrate, the electronic device electrically coupled to the plurality of electrically conductive balls, wherein the electronic device operates in an operating temperature range; and
wherein the polymer layer comprises a polymer material having a glass transition temperature that is greater than the operating temperature range.

11. The electronic device carrier structure of claim 10 wherein the polymer layer comprises a polymer material having a glass transition temperature that is at least 20 degrees Centigrade greater than the operating temperature range.

12. The electronic device carrier structure of claim 1 wherein the polymer layer comprises a polymer material having a glass transition temperature that is at least equal to a melting temperature of the solder.

13. The electronic device carrier structure of claim 1 wherein the polymer layer comprises a polymer material having a glass transition temperature in a range between about 120 degrees Centigrade and about 170 degrees Centigrade.

14. The electronic device carrier structure of claim 1 wherein the polymer layer comprises a polymer material having a viscosity value selected based on a ratio of a maximum height of the electrically conductive balls above the surface of the substrate to a maximum height of the attachment boundary above the surface of the substrate.

15. The electronic device carrier structure of claim 1 wherein the polymer layer comprises a spin-coated polymer.

16. A method forming an electronic device carrier structure, the method comprising:
providing a substrate including a plurality of electrical contacts spaced apart on a surface of the substrate, the plurality of electrical contacts having a solder paste thereon;
placing a plurality of electrically conductive balls on the solder paste on the plurality of electrical contacts, wherein each of the plurality of electrically conductive balls is entirely encapsulated by a respective noble metal layer to form a surface of each of the electrically conductive balls;
soldering the plurality of electrically conductive balls to respective ones of the plurality of electrical contacts to form an attachment boundary on each electrically conductive ball where the solder ends on each surface of the plurality of electrically conductive balls;
applying a polymer material on the surface of the substrate between the plurality of electrically conductive balls; and
forming a polymer layer from the polymer material so that a surface of the polymer layer contacts the surface of each of the plurality of electrically conductive balls at a contact point on the plurality of electrically conductive balls above the attachment boundary and below an apex of each of the plurality of electrically conductive balls.

17. The method of claim 16 wherein the polymer layer comprises a polymer material having a glass transition temperature that is at least equal to a melting temperature of the solder.

18. The method of claim 16 wherein the polymer layer comprises a polymer material having a viscosity value selected based on a ratio of a maximum height of the electrically conductive balls above the surface of the substrate to a maximum height of the attachment boundary above the surface of the substrate.

19. An electronic device carrier structure comprising:
a substrate including a plurality of electrical contacts spaced apart on the substrate;
a plurality of electrically conductive balls, each of the electrically conductive balls being on a respective one of the plurality of electrical contacts;
solder attaching each of the electrically conductive balls to respective ones of the electrical contacts, wherein a surface of the solder terminates at an attachment boundary on a surface of each of the plurality of electrically conductive balls; and a polymer layer on the substrate and partially on each of the plurality of electrically conductive balls, wherein a surface of the polymer layer terminates a contact point on each electrically conductive ball, the contact point being positioned between the attachment boundary and an apex of the respective electrically conductive ball, thereby forming a barrier around the solder for each electrically conductive ball, wherein the polymer layer comprises a polymer material with a viscosity value selected based on the ratio of a maximum height of the electrically conductive balls relative to a surface of the substrate to the maximum height of the attachment boundary relative to the surface of the substrate, and wherein the polymer material has a glass transition temperature that is at least equal to a melting temperature of the solder and greater than an operating temperature range of an electronic device disposed on the substrate and electrically coupled to the plurality of electrically conductive balls.

\* \* \* \* \*